United States Patent
Ramaswamy et al.

(10) Patent No.: US 8,673,706 B2
(45) Date of Patent: Mar. 18, 2014

(54) METHODS OF FORMING LAYERS COMPRISING EPITAXIAL SILICON

(75) Inventors: Nirmal Ramaswamy, Boise, ID (US); Gurtej S. Sandhu, Boise, ID (US); Chris M. Carlson, Boise, ID (US); F. Daniel Gealy, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 1818 days.

(21) Appl. No.: 10/932,151

(22) Filed: Sep. 1, 2004

(65) Prior Publication Data
US 2006/0046440 A1 Mar. 2, 2006

(51) Int. Cl.
| H01L 21/20 | (2006.01) |
| H01L 21/36 | (2006.01) |
| H01L 21/76 | (2006.01) |
| H01L 21/338 | (2006.01) |

(52) U.S. Cl.
USPC .... 438/173; 438/429; 438/481; 257/E21.131; 257/E21.571

(58) Field of Classification Search
USPC .......... 438/429, 173, 481, 762; 257/E21.571, 257/E21.131
See application file for complete search history.

(56) References Cited

U.S. PATENT DOCUMENTS

| 4,526,631 | A |   | 7/1985 | Silvestri et al. |         |
|-----------|---|---|--------|------------------|---------|
| 4,528,047 | A |   | 7/1985 | Beyer et al.     |         |
| 4,758,531 | A | * | 7/1988 | Beyer et al.     | 438/429 |
| 4,816,098 | A | * | 3/1989 | Davis et al.     | 156/345.31 |
| 4,847,210 | A |   | 7/1989 | Hwang et al.     |         |
| 5,039,625 | A | * | 8/1991 | Reisman et al.   | 438/297 |
| 5,073,516 | A | * | 12/1991| Moslehi          | 438/429 |
| 5,198,071 | A |   | 3/1993 | Scudder et al.   |         |
| 5,248,385 | A | * | 9/1993 | Powell           | 438/507 |
| 5,250,837 | A |   | 10/1993| Sparks           |         |
| 5,294,286 | A |   | 3/1994 | Nishizawa et al. |         |
| 5,340,754 | A |   | 8/1994 | Witek et al.     |         |
| 5,460,994 | A |   | 10/1995| Kim              |         |
| 5,599,724 | A |   | 2/1997 | Yoshida          |         |
| 5,707,885 | A | * | 1/1998 | Lim              | 438/155 |
| 5,753,542 | A |   | 5/1998 | Yamazaki et al.  |         |
| 5,753,555 | A |   | 5/1998 | Hada             |         |
| 5,763,305 | A |   | 6/1998 | Chao             |         |
| 5,786,229 | A |   | 7/1998 | Park             |         |
| 5,795,809 | A |   | 8/1998 | Gardner et al.   |         |
| 5,866,930 | A |   | 2/1999 | Saida et al.     |         |
| 6,060,746 | A |   | 5/2000 | Bertin et al.    |         |
| 6,064,081 | A |   | 5/2000 | Robinson et al.  |         |
| 6,156,620 | A |   | 12/2000| Puchner et al.   |         |

(Continued)

OTHER PUBLICATIONS

Bashir et al., *Characterization and modeling of sidewall defects in selective epitaxial growth of silicon*, J. Vac. Sci. Technol. B 13(3), pp. 928-935 (May/Jun. 1995).

(Continued)

*Primary Examiner* — Charles Garber
*Assistant Examiner* — Ron Pompey
(74) *Attorney, Agent, or Firm* — Wells St. John P.S.

(57) ABSTRACT

The invention includes methods of forming layers comprising epitaxial silicon. In one implementation, an opening is formed within a first material received over a monocrystalline material. Opposing sidewalls of the opening are lined with a second material, with monocrystalline material being exposed at a base of the second material-lined opening. A silicon-comprising layer is epitaxially grown from the exposed monocrystalline material within the second material-lined opening. At least a portion of the second material lining is in situ removed. Other aspects and implementations are contemplated.

45 Claims, 13 Drawing Sheets

(56) References Cited

U.S. PATENT DOCUMENTS

| | | | |
|---|---|---|---|
| 6,204,532 B1 | 3/2001 | Gambino et al. | |
| 6,297,531 B2 | 10/2001 | Armacost et al. | |
| 6,406,962 B1 | 6/2002 | Agnello et al. | |
| 6,436,770 B1 | 8/2002 | Leung et al. | |
| 6,437,375 B1 | 8/2002 | Beaman | |
| 6,448,129 B1 | 9/2002 | Cho et al. | |
| 6,492,216 B1 | 12/2002 | Yeo et al. | |
| 6,506,638 B1 | 1/2003 | Yu | |
| 6,518,609 B1 | 2/2003 | Ramesh | |
| 6,605,498 B1 | 8/2003 | Murthy et al. | |
| 6,617,226 B1 | 9/2003 | Suguro et al. | |
| 6,624,032 B2 | 9/2003 | Alavi et al. | |
| 6,632,712 B1 | 10/2003 | Ang et al. | |
| 6,642,539 B2 | 11/2003 | Ramesh et al. | |
| 6,660,590 B2 | 12/2003 | Yoo | |
| 6,703,290 B2 | 3/2004 | Boydston et al. | |
| 6,713,378 B2 | 3/2004 | Drynan | |
| 6,716,687 B2 | 4/2004 | Wang et al. | |
| 6,716,719 B2 | 4/2004 | Clampitt et al. | |
| 6,734,082 B2 | 5/2004 | Zheng et al. | |
| 6,746,923 B2 | 6/2004 | Skotnicki et al. | |
| 6,756,625 B2 * | 6/2004 | Brown | 257/300 |
| 6,777,744 B2 | 8/2004 | Noble | |
| 6,790,713 B1 | 9/2004 | Horch | |
| 6,805,962 B2 | 10/2004 | Bedell et al. | |
| 6,818,533 B2 | 11/2004 | Chen et al. | |
| 6,855,436 B2 | 2/2005 | Bedell et al. | |
| 6,858,499 B2 | 2/2005 | Bol | |
| 6,860,944 B2 * | 3/2005 | Ivanov et al. | 118/50 |
| 6,861,158 B2 | 3/2005 | Bedell et al. | |
| 6,878,592 B1 | 4/2005 | Besser et al. | |
| 6,878,990 B2 | 4/2005 | Yoo | |
| 6,885,069 B2 | 4/2005 | Ohguro | |
| 6,919,258 B2 * | 7/2005 | Grant et al. | 438/407 |
| 6,946,377 B2 | 9/2005 | Chambers | |
| 7,033,877 B2 * | 4/2006 | Chaudhry et al. | 438/212 |
| 7,132,338 B2 | 11/2006 | Samoilov et al. | |
| 7,132,355 B2 | 11/2006 | Ramaswamy et al. | |
| 7,144,779 B2 | 12/2006 | Ramaswamy et al. | |
| 7,154,118 B2 | 12/2006 | Lindert et al. | |
| 7,199,419 B2 | 4/2007 | Haller | |
| 7,241,655 B2 | 7/2007 | Tang et al. | |
| 7,262,089 B2 | 8/2007 | Abbott et al. | |
| 7,453,103 B2 | 11/2008 | Abbott et al. | |
| 7,501,760 B2 | 3/2009 | Ramaswamy et al. | |
| 7,528,424 B2 | 5/2009 | Ramaswamy et al. | |
| 2001/0010962 A1 | 8/2001 | Chen et al. | |
| 2001/0017392 A1 * | 8/2001 | Comfort et al. | 257/410 |
| 2001/0025985 A1 | 10/2001 | Noble | |
| 2001/0041438 A1 | 11/2001 | Maeda et al. | |
| 2002/0070430 A1 | 6/2002 | Oh et al. | |
| 2002/0081861 A1 | 6/2002 | Robinson et al. | |
| 2003/0027406 A1 | 2/2003 | Malone | |
| 2003/0141278 A1 | 7/2003 | Chang et al. | |
| 2003/0153155 A1 | 8/2003 | Wang et al. | |
| 2003/0194496 A1 | 10/2003 | Xu et al. | |
| 2003/0211712 A1 | 11/2003 | Chen et al. | |
| 2003/0234414 A1 | 12/2003 | Brown | |
| 2004/0121546 A1 | 6/2004 | Yoo | |
| 2004/0241460 A1 | 12/2004 | Bedell et al. | |
| 2005/0079691 A1 | 4/2005 | Kim et al. | |
| 2005/0224800 A1 | 10/2005 | Lindert et al. | |
| 2006/0046391 A1 | 3/2006 | Tang et al. | |
| 2006/0081884 A1 | 4/2006 | Abbott et al. | |
| 2006/0125044 A1 | 6/2006 | Haller | |
| 2006/0264010 A1 | 11/2006 | Ramaswamy et al. | |

OTHER PUBLICATIONS

U.S. Appl. No. 10/931,924, filed Sep. 1, 2004, Ramaswamy et al.
U.S. Appl. No. 10/932,129, filed Sep. 1, 2004, Ramaswamy et al.
U.S. Appl. No. 11/035,298, filed Jan. 12, 2005, Blomiley et al.

* cited by examiner

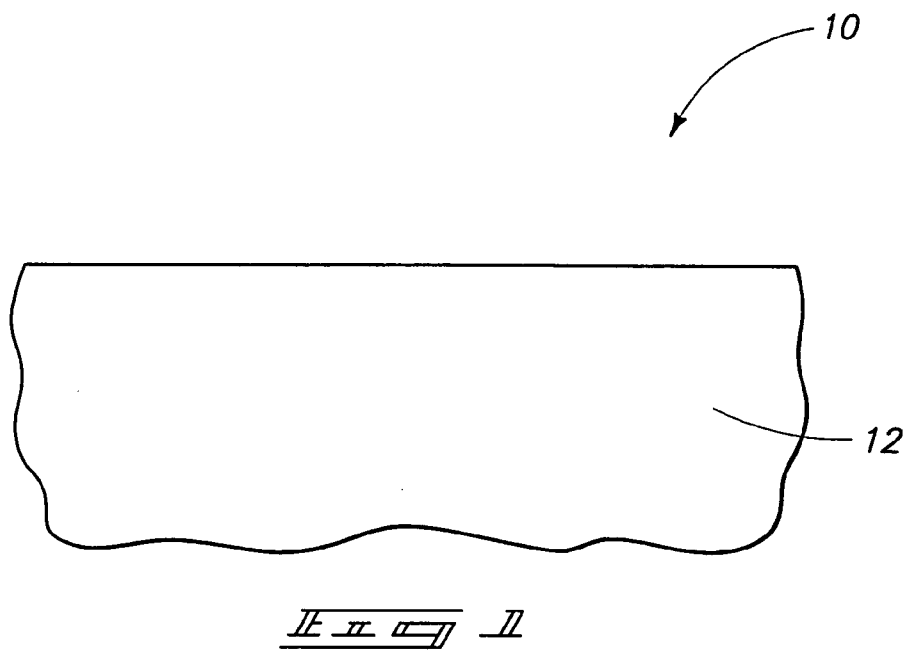
_Fig 1_
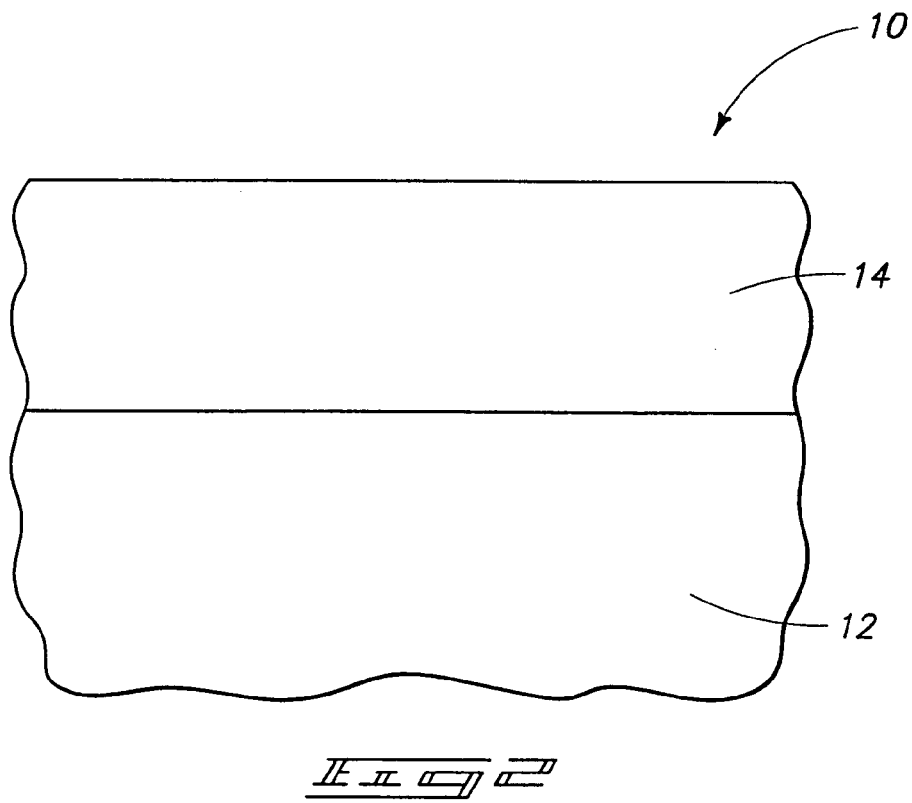
_Fig 2_

METHODS OF FORMING LAYERS COMPRISING EPITAXIAL SILICON

TECHNICAL FIELD

This invention relates to methods of forming layers comprising epitaxial silicon.

BACKGROUND OF THE INVENTION

Silicon is a common semiconductive material used in the fabrication of integrated circuits. Silicon can occur in crystalline and amorphous forms, and when crystalline can be monocrystalline or polycrystalline. In some instances, silicon is combined with germanium, essentially forming a silicon germanium alloy. Such materials can be doped with conductivity enhancing impurities (i.e., boron and/or phosphorus) to modify the conducting characteristics of the silicon-comprising material.

Monocrystalline silicon can be provided in bulk substrate form or otherwise grown or deposited epitaxially from an exposed monocrystalline material. Epitaxy generally involves the growth or deposition of a single or monocrystalline layer of material such that the epitaxial layer has a crystal orientation which is common to that of the material from which it is grown. One factor that determines the quality of the epitaxial silicon-comprising layer relates to the presence and quantity of crystallographic defects. Such are non-uniformities in the crystal structure of the epitaxial layer. Many of these defects are caused by defects appearing at the surface of the substrate which propagate into the layer during growth. Examples include sidewall dislocations and stacking faults. Dislocations and stacking faults can be electrically active more so than the surrounding material within the epitaxial layer due to the presence of dangling bonds. Such can lead to unnecessary recombination generation currents, lower breakdown voltages, higher current leakage and larger junction ideality factors.

One place where epitaxial silicon has been utilized is as one or more of the components in a field effect transistor. Transistor structures comprise a channel region received between a pair of source/drain regions, and a gate configured to electrically connect the source/drain regions to one another through the channel region. The transistor constructions utilized in semiconductor constructions are supported by a semiconductor substrate. The semiconductor substrate will have a primary surface which can be considered to define a horizontal direction. Transistor devices can be divided into two broad categories based upon the orientations of the channel regions relative to the primary surface of the semiconductor substrate. Specifically, transistor structures which have channel regions that are primarily parallel to the primary surface of the substrate are referred to as planar or horizontal transistor structures, and those having channel regions which are generally perpendicular to the primary surface of the substrate are referred to as vertical transistor structures. Since current flow between the source and drain regions of a transistor device occurs through the channel region, planar transistor devices can be distinguished from vertical transistor devices based upon the direction of current flow as well as on the general orientation of the channel region. Specifically, vertical transistor devices are devices in which the current flow between the source and drain regions of the devices is primarily substantially orthogonal to a primary surface of a semiconductor substrate, and planar or horizontal transistor devices are devices in which the current flow between source and drain regions is primarily parallel to the primary surface of the semiconductor substrate.

Epitaxial silicon-comprising materials have been proposed for use in channel regions of vertical transistors. Further, one or both of the source/drain areas of a vertical transistor might also comprise epitaxially grown silicon or an epitaxially grown silicon germanium alloy. Requirements for epitaxial materials within a vertically oriented channel region are typically more stringent than for the use of such material in source/drain regions of horizontally oriented field effect transistors. Further, fabrication of vertical field effect transistors typically utilizes masks of oxide, nitride or other materials for self-aligned patterning of the epitaxial silicon-comprising material during its formation. The interface of the epi with these materials can be a defect source. Further, the selective epitaxial growth of silicon for vertical transistors typically utilizes lower deposition temperatures as compared to blanket epitaxial silicon depositions. Unfortunately, the use of lower temperatures reduces surface mobility and can also result in increased defects over that of higher temperature processing. Also and regardless, thermal stress can be generated during cool-down of the substrate from the temperature at which the epitaxial silicon-comprising material was grown. This can result in crystallographic defects being generated after growth.

Further, where the epitaxial silicon-comprising material includes germanium, such has an increased tendency for defect formation on the surface during deposition due to mismatched lattice constants of silicon and germanium. These defects propagate and either terminate with other defects or at the surface. Regardless, after deposition, crystallographic defects are extremely difficult to remove or heal within the bulk epitaxially grown material or at interfaces of such material with other materials.

While the invention was motivated in addressing the above identified issues, it is in no way so limited. The invention is only limited by the accompanying claims as literally worded, without interpretative or other limiting reference to the specification, and in accordance with the doctrine of equivalents.

SUMMARY

The invention includes methods of forming layers comprising epitaxial silicon. In one implementation, an opening is formed within a first material received over a monocrystalline material. Opposing sidewalls of the opening are lined with a second material, with monocrystalline material being exposed at a base of the second material-lined opening. A silicon-comprising layer is epitaxially grown from the exposed monocrystalline material within the second material-lined opening. At least a portion of the second material lining is in situ removed.

In one implementation, a method of forming a layer comprising epitaxial silicon includes providing an opening within a first material received over a monocrystalline material. Opposing sidewalls of the opening are lined with a second material, with monocrystalline material being exposed at a base of the second material-lined opening. A silicon-comprising layer is epitaxially grown from the exposed monocrystalline material within the second material-lined opening at a temperature greater than 200° C. After the growing, at least a portion of the second material lining is removed prior to cooling the epitaxially grown silicon-comprising material to a temperature below 200° C.

In one implementation, a method of forming a layer comprising epitaxial silicon includes providing an opening within a first material received over a monocrystalline material. The opening comprises opposing sidewalls. Opposing walls are formed within the opening and which are laterally displaced inwardly of the opposing sidewalls. A space is received between the opposing walls and the opposing sidewalls. A silicon-comprising layer is epitaxially grown between the opposing walls from monocrystalline material exposed at a base of the opening.

Other aspects and implementations are contemplated.

BRIEF DESCRIPTION OF THE DRAWINGS

Preferred embodiments of the invention are described below with reference to the following accompanying drawings.

FIG. 1 is a diagrammatic sectional view of a semiconductor substrate in process in accordance with an aspect of the invention.

FIG. 2 is a diagrammatic top plan view of the FIG. 1 substrate, with FIG. 1 being a cut taken through line 1-1 in FIG. 2.

DETAILED DESCRIPTION OF THE PREFERRED EMBODIMENTS

Figure 3:
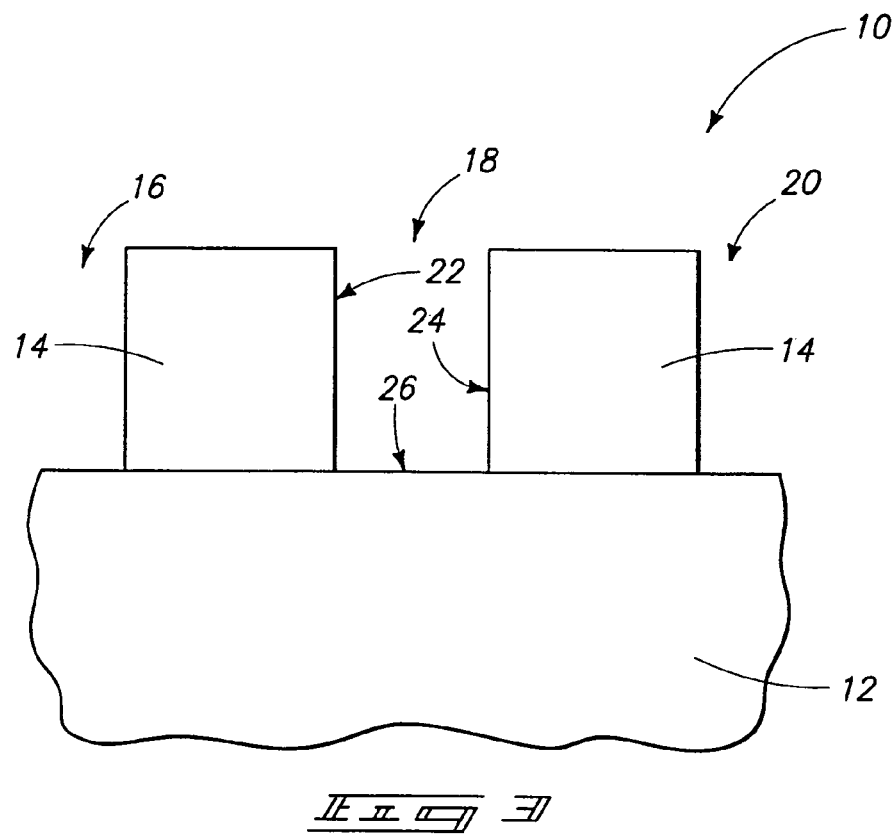
FIG. 3 is a view of the FIG. 1 substrate at a processing step subsequent to that shown by FIG. 1.

This disclosure of the invention is submitted in furtherance of the constitutional purposes of the U.S. Patent Laws "to promote the progress of science and useful arts" (Article 1, Section 8).

Exemplary first embodiment methods of forming layers comprising epitaxial silicon are initially described with reference to FIGS. 1-11. Referring to FIG. 1, a substrate, preferably a semiconductor substrate, is indicated generally with reference numeral 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Substrate 10 comprises a monocrystalline material 12, for example and by way of example only, lightly doped monocrystalline silicon or a monocrystalline silicon germanium alloy. Such might be provided by any existing or yet-to-be developed methods, for example as a bulk monocrystalline substrate, a semiconductor-on-insulator substrate, epitaxially grown, etc. A first material 14 has been formed over monocrystalline material 12, and in the depicted exemplary embodiment on such material. In the context of this document, "on" means in at least some direct physical contact therewith. First material 14 might comprise any insulative, semiconductive and/or conductive material (including conductively doped semiconductive material). Further, some or all of such material might be sacrificial, and some or all of such material might remain over the substrate in a finished integrated circuitry construction.

An opening 16 has been provided within first material 14. An exemplary method for forming the same comprises photolithographic patterning and etch, although any existing or yet-to-be developed methods are also contemplated. For example and by way of example only, opening 16 might be provided by laser ablation, masked or maskless formation of material 14 over substrate 12, etc. In the embodiment exemplified by FIG. 1, opening 16 is formed within first material 14 to extend to monocrystalline material 12. For purposes of the continuing discussion, opening 16 can be considered as having opposing sidewalls 17 and 18. In one preferred implementation, the opening is formed to be in the shape of a line trench formed within first material 14 (FIG. 2). Of course, opening 16 might be of any other shape including (by way or example only) circular, elliptical, oval, etc. Further, opening 16 might not extend all the way to monocrystalline material 12, as will be apparent in the continuing discussion.

Exemplary insulative materials for first material 14 include $Si_3N_4$, $SiO_2$, and silicon oxynitride ($SiO_xN_y$). An exemplary conductive material for first material 14 includes doped carbon.

Referring to FIG. 3, a second material 20 has been deposited over first material 14 and to within opening 16 laterally over sidewalls 17 and 18. Second material 20 might be insulative or conductive, with all or some of such being removed in the inventive described fabrication methods, and as well may or may not constitute a portion of the finished integrated circuitry construction. Exemplary preferred insulative materials include $SiO_2$, $SiO_xN_y$, $Si_3N_4$, $Al_2O_3$ and $HfO_2$. An exemplary conductive material includes doped carbon.

Figure 4:
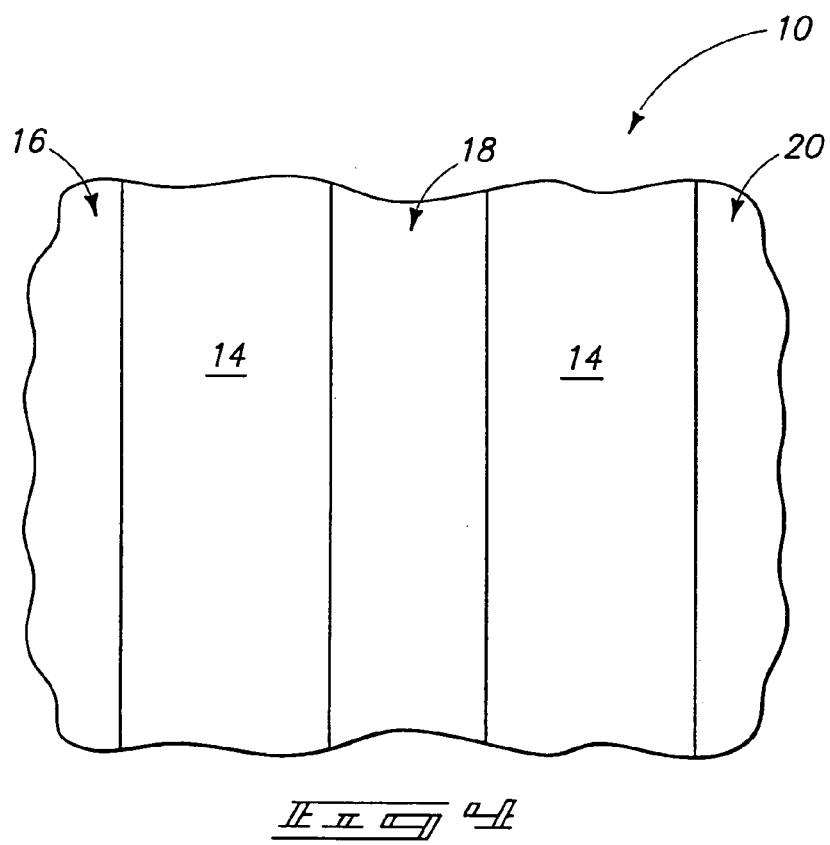
FIG. 4 is a view of the FIG. 3 substrate at a processing step subsequent to that shown by FIG. 3.

Referring to FIG. 4, second material 20 has been anisotropically etched effective to expose monocrystalline material 12 within opening 16. Such describes but one preferred exemplary method of lining opposing sidewalls 17 and 18 of opening 16 with a second material 20, and exposing monocrystalline material 12 at a base 21 of second material-lined opening 16.

Figure 5:
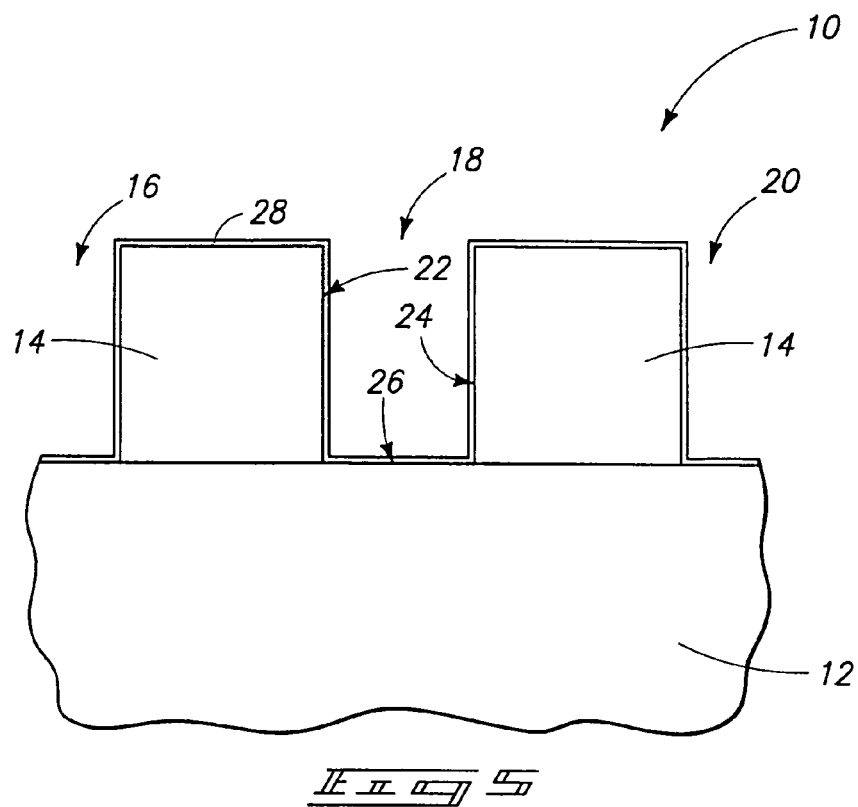
FIG. 5 is a view of the FIG. 4 substrate at a processing step subsequent to that shown by FIG. 4.

Referring to FIG. 5, a silicon-comprising layer 22 has been epitaxially grown from exposed monocrystalline material 12 within second material-lined opening 16. The epitaxial growth of silicon-comprising layer 22 might occur by any existing or yet-to-be developed methods. An exemplary preferred technique includes a temperature range of from 300° C. to 1,000° C., and a pressure range of from 10 mTorr to 100 Torr. Exemplary preferred gases for the deposition of epitaxial silicon include dichlorosilane at 0.2 liters/minute, $H_2$ at 20 liters/minute, and HCl at 0.15 liter/minute in a single wafer processor having a chamber volume of from eight to twelve liters. If, by way of example only, the silicon-comprising layer is to comprise a silicon germanium alloy, $GeH_4$ is an exemplary preferred gas flowed proportionally relative to the volume flow of dichlorosilane to achieve the desired concentration of germanium. In one exemplary implementation, the epitaxial growing occurs at a temperature of greater than 200° C., more preferably at a temperature of at least 600° C., and even more preferably at a temperature of at least 800° C. Epitaxially grown silicon material 22 might be provided to less than completely fill opening 16 (as shown), exactly fill opening 16, or overfill to extend above and outwardly of opening 16 relative to materials 14 and 20. For purposes of the continuing discussion, second material lining 20 in FIG. 5 can be considered as having an elevational thickness 25.

Figure 6:
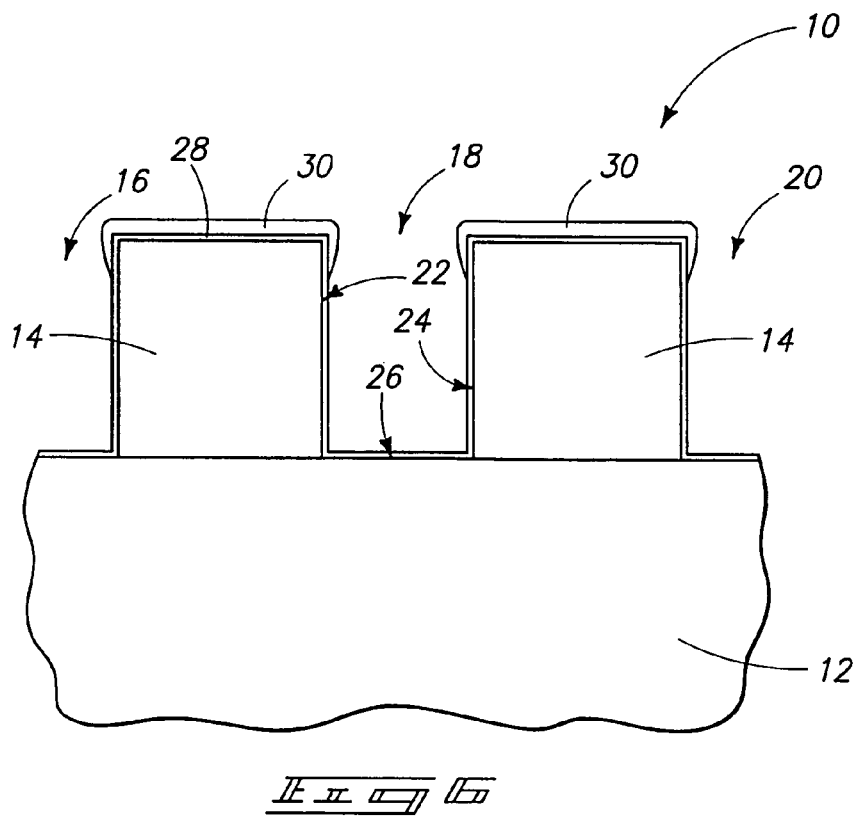
FIG. 6 is a view of the FIG. 5 substrate at a processing step subsequent to that shown by FIG. 5.

Referring to FIG. 6, at least a portion of second material lining 20 has been removed. In one preferred implementation, such removing occurs in situ. In the context of this document, "in situ" requires a stated action to occur within the same chamber within which the silicon-comprising layer was epitaxially grown.

In one preferred implementation, the removing of at least a portion of second material lining 20 occurs prior to cooling the epitaxially grown silicon-comprising material to a temperature below 200° C. The removing might be conducted at a temperature the same as that of the epitaxial growing, greater than that of the epitaxial growing, or less than that of the epitaxial growing. In specific preferred implementations, the removing occurs at a temperature at or below the temperature of the epitaxial growing, preferably within 200° C. of that of the growing, more preferably within 100° C. that of the growing, and even more preferably within 50° C. of that of the growing. In one preferred implementation, the removing is at a temperature lower than that of the growing but not at lower than 600° C. With respect to such temperatures at which the removing occurs, such are most preferably conducted in situ, although such is not required.

In one implementation, the removing occurs by etching, and for example with such etching preferably being selective relative to first material 14. In the context of this document, a selective etch requires a removal rate of one material relative another at a ratio of at least 2:1. Exemplary preferred etching comprising wet etching. For example where material 14 comprises silicon nitride and material 20 comprises silicon dioxide, an exemplary wet etching chemistry for silicon dioxide which is selective to silicon and silicon nitride comprises a combination of HF, ammonium hydroxide and hydrogen peroxide. Regardless, the removing might be of only a portion of second material lining 20, or might be of all remaining of the second material lining (as shown in FIG. 6). By way of example only and not by way of limitation, a preferred reason for removing at least some of the lining prior to cooling as described above is to minimize thermal stress against sidewalls of the epitaxially grown silicon that would otherwise occur where material is received against such sidewalls during cooling, thereby preferably advantageously minimizing dislocation faults that might otherwise occur upon appreciable cooling of the substrate if all of material 20 was present. Regardless, the removing by etching or otherwise might occur at a temperature at, below, or above a temperature at which the epitaxial growing occurs.

Figure 7:
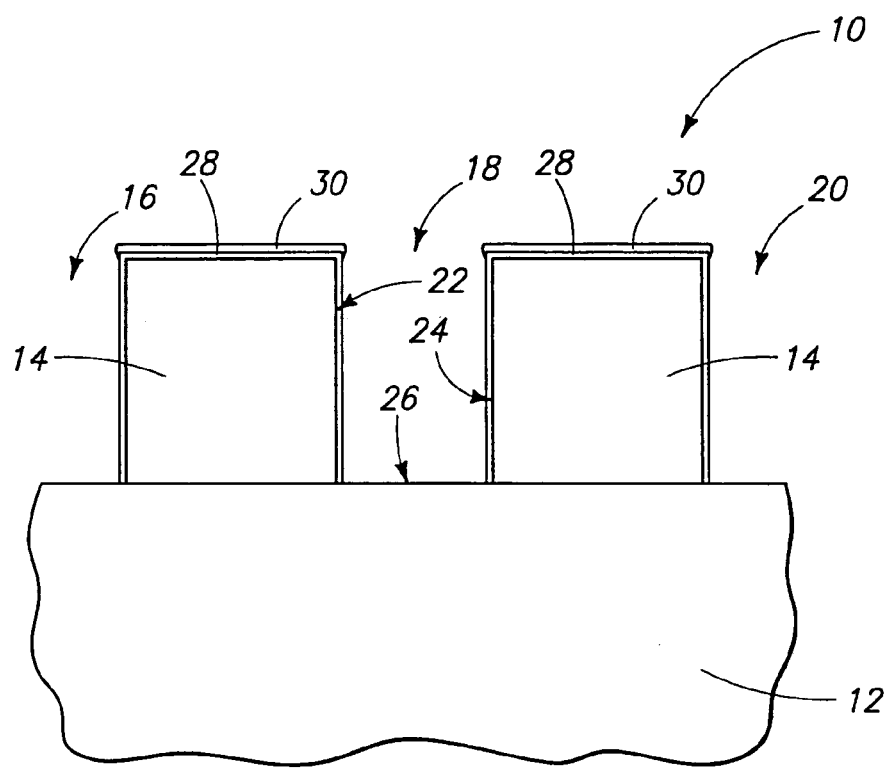
FIG. 7 is a diagrammatic sectional view of a semiconductor substrate in process in accordance with an aspect of the invention.
Figure 8:
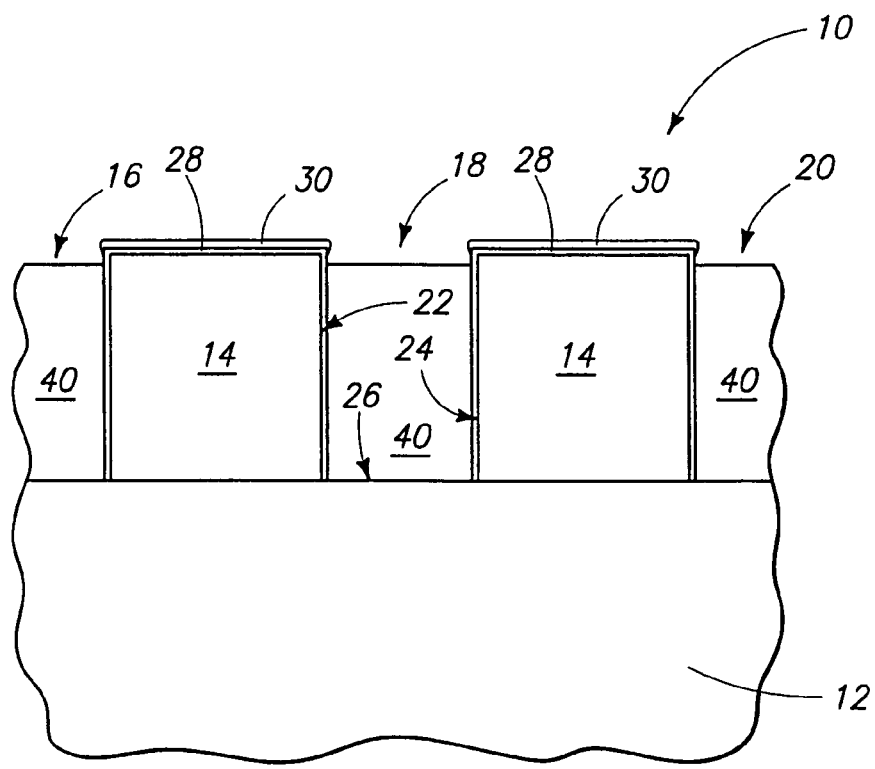
FIG. 8 is a diagrammatic sectional view of a semiconductor substrate in process in accordance with an aspect of the invention.

FIGS. 1-6 illustrate an exemplary embodiment wherein the removing is of all remaining second material lining 20. By way of example only, FIG. 7 depicts an alternate embodiment substrate fragment 10a wherein only a portion of second material lining 20 has been removed, leaving portions 20a. Like numerals from the first embodiment are utilized where appropriate, with differences being indicated with the suffix "a". Further in accordance with the exemplary FIG. 7 embodiment, only a portion of elevational thickness 25 of second material lining 20 (FIG. 5) has been removed in the embodiment of FIG. 7. However by way of example only, FIG. 8 depicts an exemplary alternate embodiment 10b wherein all of an elevational thickness portion of elevational thickness 25 has been removed, leaving second material lining 20b. Like numerals from the first embodiment are utilized where appropriate, with differences being indicated with the suffix "b".

Figure 9:
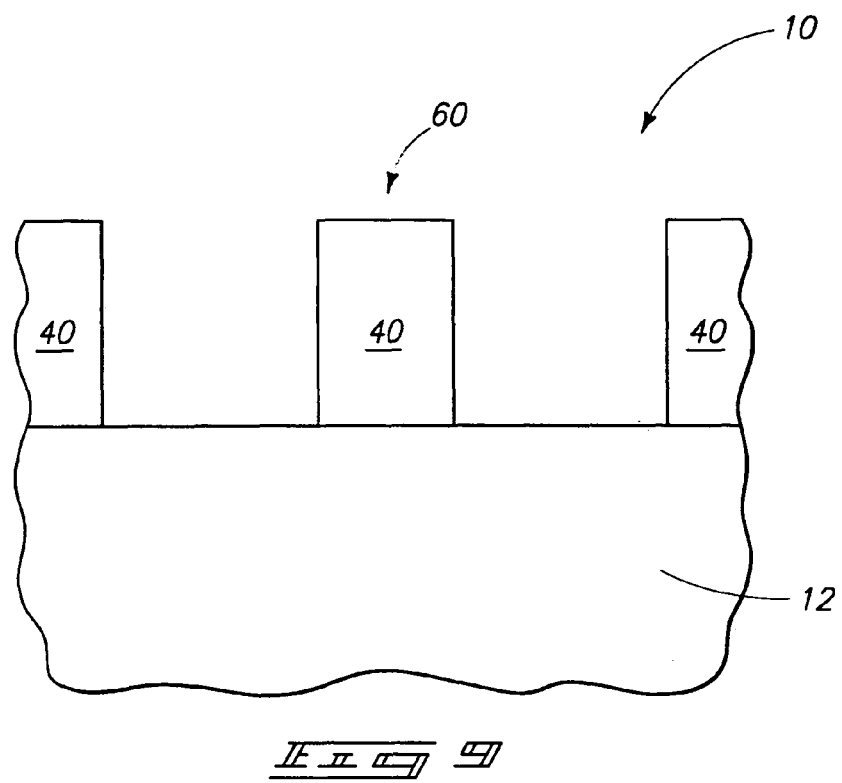
FIG. 9 is a diagrammatic sectional view of a semiconductor substrate in process in accordance with an aspect of the invention.
Figure 10:
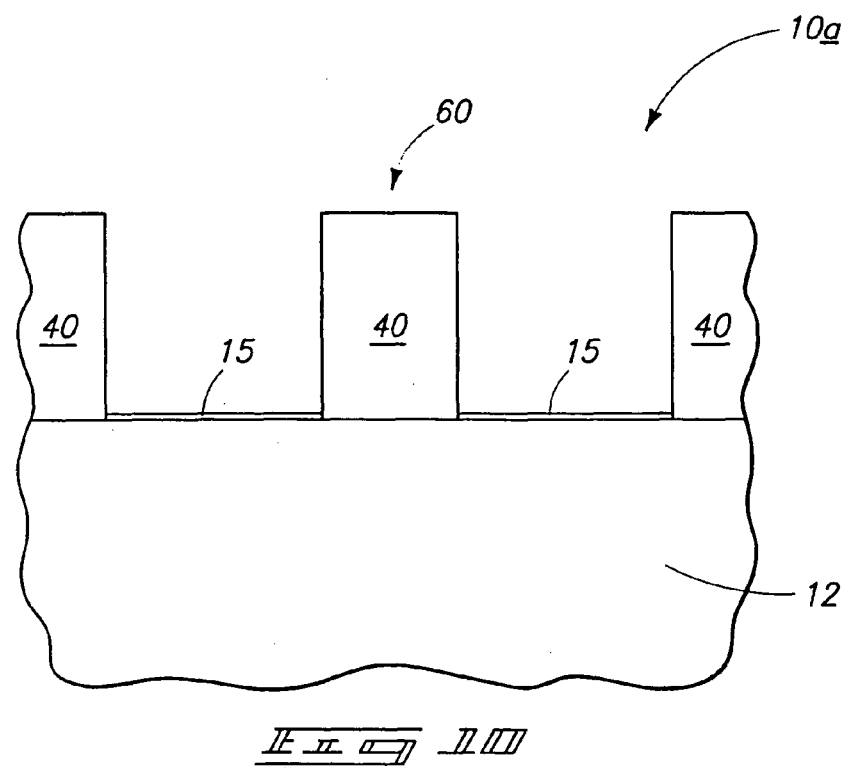
FIG. 10 is a diagrammatic sectional view of a semiconductor substrate in process in accordance with an aspect of the invention.

By way of example only, the FIGS. 1-8 embodiments depict most preferred implementations wherein the stated removing occurs after the epitaxial growing has occurred. However, aspects of the invention also contemplate removing at least a portion of the second material lining before the growing, for example as depicted with respect to a substrate fragment 10c in FIG. 9. Like numerals from the first embodiment are utilized where appropriate, with differences being indicated with the suffix "c". FIG. 9 depicts the removal of a portion of second material 20, leaving second material masses 20c prior to the growth of an epitaxial silicon-comprising layer (not shown) having occurred. By way of example only, processing might otherwise occur subsequent to FIG. 9 to produce a FIG. 7 like construction.

Further by way of example only, the exemplary FIGS. 1-9 embodiments above depict opening 16 formed within first material 14 as extending all the way to monocrystalline material 12 prior to the lining of the opposing sidewalls of such opening. By way of example only, an exemplary alternate embodiment 10d is described with reference to FIGS. 10 and 11. Like numerals from the first embodiment are utilized where appropriate, with differences being indicated with the suffix "d". Opening 16d within first material 14d does not extend to monocrystalline material 12 prior to lining opposing sidewalls of opening 16d with second material 20d.

Figure 11:
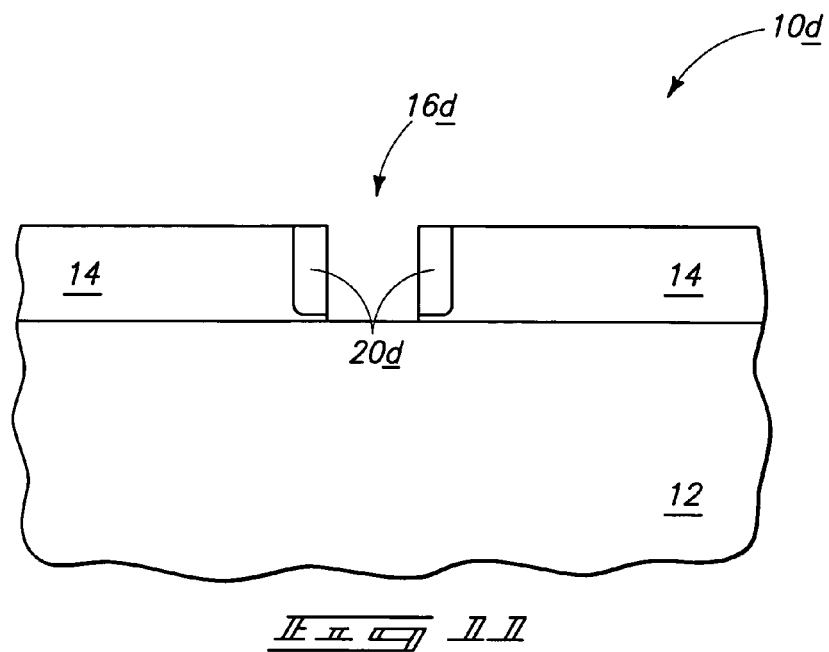
FIG. 11 is a view of the FIG. 10 substrate at a processing step subsequent to that shown by FIG. 10.

Referring to FIG. 11, one or more anisotropic etching chemistries and techniques have been utilized to extend opening 16d to monocrystalline material 12. Processing could otherwise occur in accordance with the various other exemplary implementations described above, or otherwise.

Figure 12:
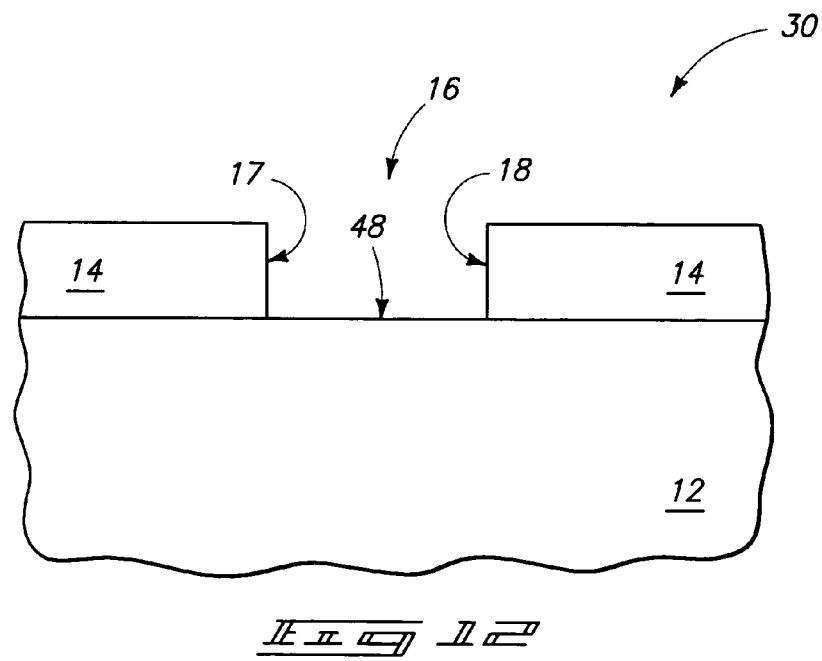
FIG. 12 is a diagrammatic sectional view of a semiconductor substrate in process in accordance with an aspect of the invention.

Exemplary additional implementations are next described with reference to FIGS. 12-20. Certain aspects of the above implementations might, of course, be utilized or combined with those of the following implementations. Referring to FIG. 12, a semiconductor substrate in process is indicated generally with reference numeral 30. Such comprises materials 12 and 14, preferably having the properties and attributes as described in the FIGS. 1-6 embodiment. An opening 16 has been provided within first material 14, with such, for the purposes of the continuing discussion, comprising opposing sidewalls 17 and 18, and a base 48. Preferred manners of fabrication of opening 16 are as described above in connection with the FIGS. 1-6 embodiment. Accordingly, opening 16 preferably extends completely to monocrystalline silicon material 12, although such is not required.

Figure 13:
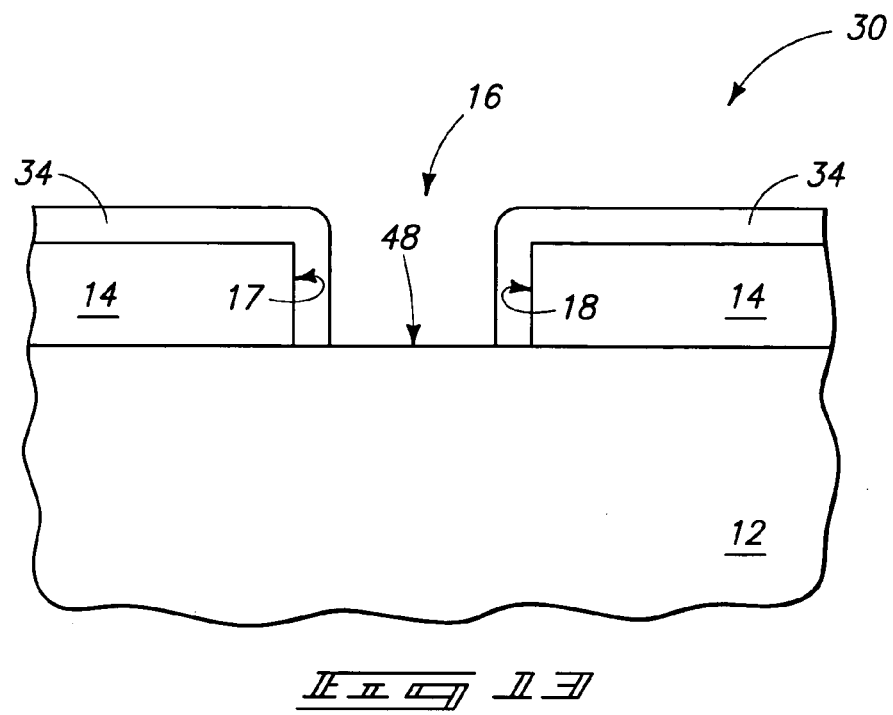
FIG. 13 is a view of the FIG. 12 substrate at a processing step subsequent to that shown by FIG. 12.

Referring to FIG. 13, a second material 34 has been deposited over first material 14 within opening 16 and along opposing sidewalls 17 and 18, and to less than completely fill opening 16. Second material 34 is different in composition from that of first material 14. In the depicted exemplary preferred embodiment, such has been deposited to a suitable thickness to be, and then is, subsequently anisotropically etched to expose monocrystalline material 12 within opening 16. Such etching might, of course, etch all of second material 34 from over first material 14, although such is not depicted. Exemplary preferred materials for second material 34 are the same as those for first material 14, with different compositions being used for first material 14 and second material 34.

Figure 14:
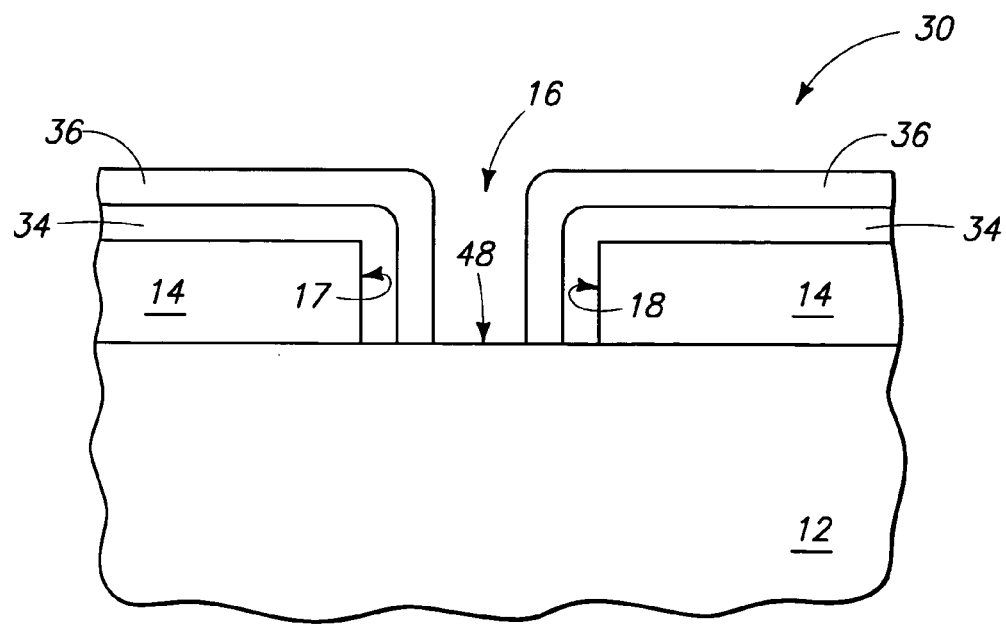
FIG. 14 is a view of the FIG. 13 substrate at a processing step subsequent to that shown by FIG. 13.

Referring to FIG. 14, a third material 36 has been deposited over second material 34 within opening 16 to less than completely fill the remaining volume of opening 16. Third material 36 is different in composition from that of second material 34. Further by way of example only, first material 14 and third material 34 might be of the same composition or of different compositions. Further by way of example only, FIG. 14 depicts layer 36 as having been deposited to a suitable thickness to be, and then is, anisotropically etched to expose monocrystalline material 12 within opening 16. Such etching might, of course, etch all of third material 36 from over first material 14, although such is not depicted.

Figure 15:
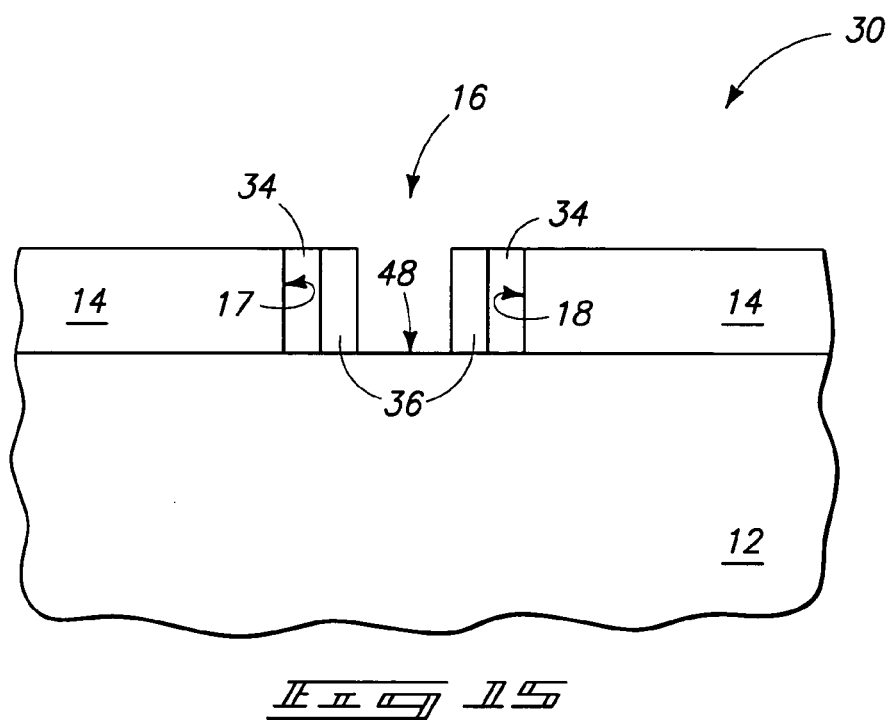
FIG. 15 is a view of the FIG. 14 substrate at a processing step subsequent to that shown by FIG. 14.

Referring to FIG. 15, the substrate has been suitably polished, for example by chemical-mechanical polishing (CMP), effective to remove third material 36 and second material 34 from outwardly of first material 14.

Figure 16:
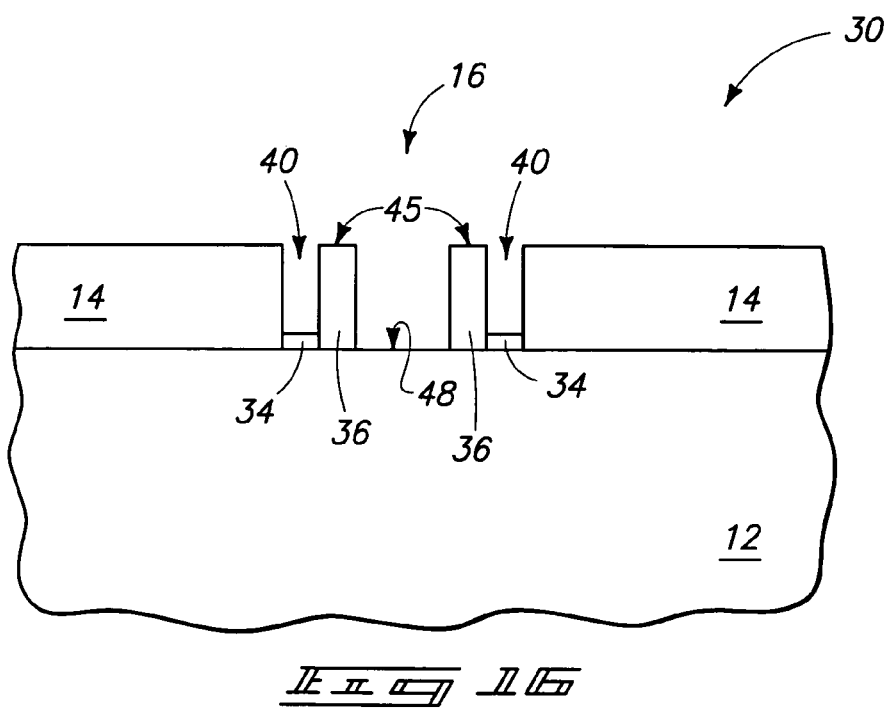
FIG. 16 is a view of the FIG. 15 substrate at a processing step subsequent to that shown by FIG. 15.

Referring to FIG. 16, at least some of second material 34 has been removed from between first and third materials 14 and 36, respectively, within opening 16 effective to form respective spaces 40 between first material 14 and third material 36. In one implementation and by way of example only, the above-described FIGS. 12-16 embodiment provides but one exemplary manner of forming opposing walls 45 within opening 16 which are laterally displaced inwardly of opposing sidewalls 17 and 18, with a space 40 being received between opposing walls 45 and opposing sidewalls 17 and 18. An exemplary preferred manner of forming the exemplary depicted walls 45 is by etching, for example wet etching of second material 34. In the exemplary depicted FIG. 16 embodiment, the etching is of only some of second material 34 from between first material 14 and third material 36 within opening 16 such that spaces 40 do not extend to monocrystalline material 12.

In one exemplary implementation, opposing walls 45 are comprised of a composition the same as that of first material 14, and in one exemplary preferred implementation, opposing walls 45 are of a composition consisting essentially the same as that of first material 14. Alternately by way of example only, opposing walls 45 might be comprised of a composition different from that of first material 14. Further in one exemplary implementation, and as shown, opposing walls 45 extend from monocrystalline material 12. Further as shown and described, at least some aspect of forming opposing walls 45 comprises etching in one preferred implementation. In one preferred aspect, the etching comprises etching a second material (i.e., material 34) different in composition from that of first material 14 and different in composition from that of opposing walls 45. Further in one implementation, the forming of the opposing walls comprises CMP, and in one exemplary preferred embodiment as described, comprises both etching and CMP. In one implementation, the CMP is of at least material from which the opposing walls are formed, and the etching is of at least a second material different in composition from that of the first material and different in composition from that of the opposing walls, and in one preferred implementation, with the CMP being of both the material from which the opposing walls are formed and of the second material.

Figure 17:
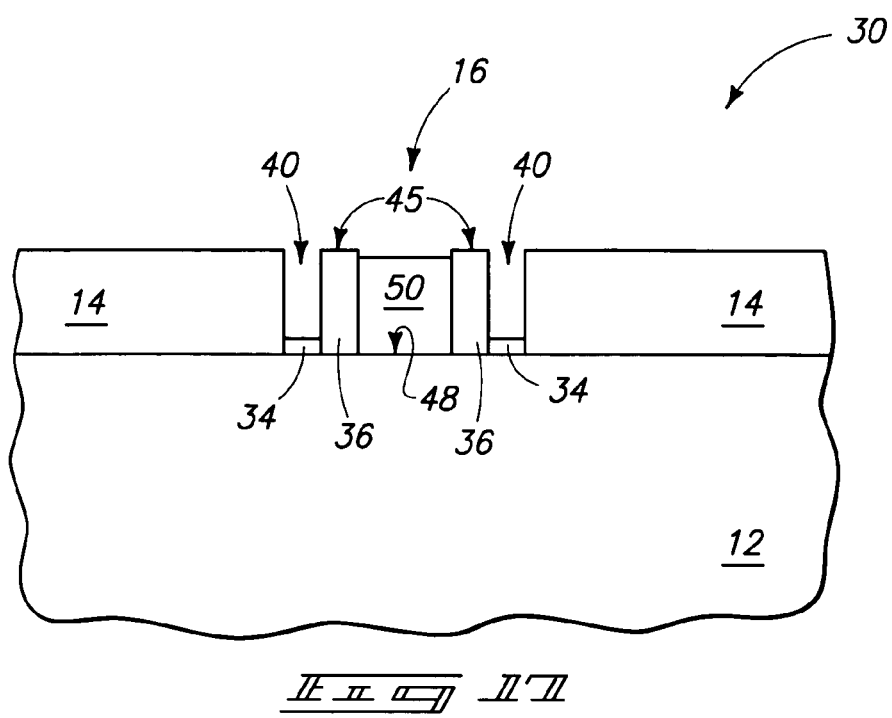
FIG. 17 is a view of the FIG. 16 substrate at a processing step subsequent to that shown by FIG. 16.

Referring to FIG. 17, a silicon-comprising layer 50 has been epitaxially grown between opposing walls 45 from monocrystalline material 12 exposed at base 48 of opening 16. In the depicted preferred embodiment where space 40 does not extend all the way to monocrystalline material 12, the epitaxial silicon growing does not also grow a silicon-comprising layer within spaces 40. Preferred manners of growing and compositions for epitaxial silicon-comprising 50 are the same as those described above in connection with the earlier embodiments.

Figure 18:
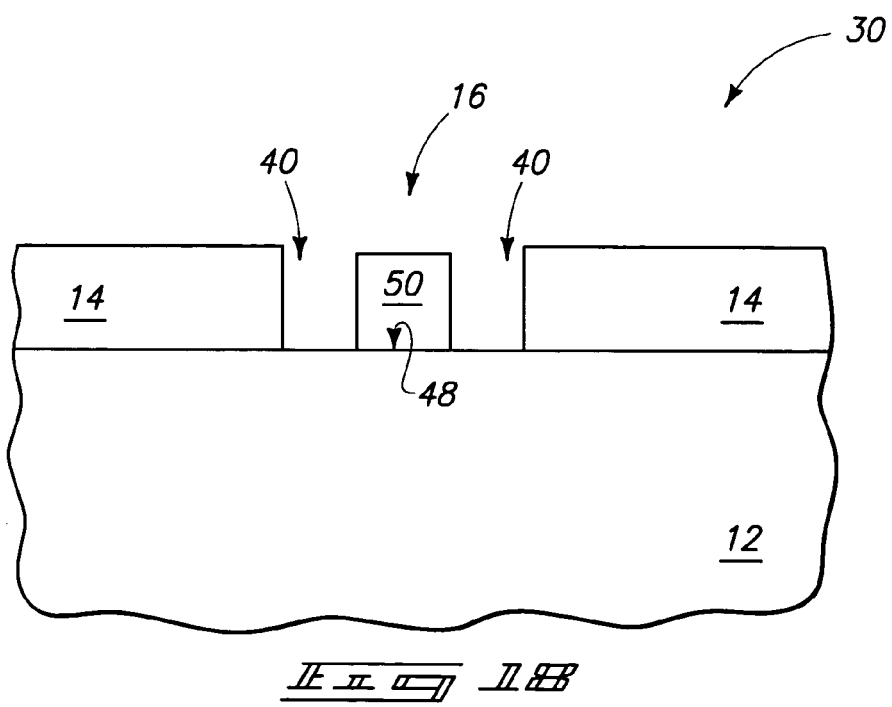
FIG. 18 is a view of the FIG. 17 substrate at a processing step subsequent to that shown by FIG. 17.

In one exemplary embodiment, at least some of opposing walls 45 are etched after the epitaxial growing, and in one embodiment all remaining of such walls are etched after the epitaxial growing, for example as depicted in FIG. 18. FIG. 18 also depicts remaining second material 34 having been etched from the substrate in one preferred implementation.

Figure 19:
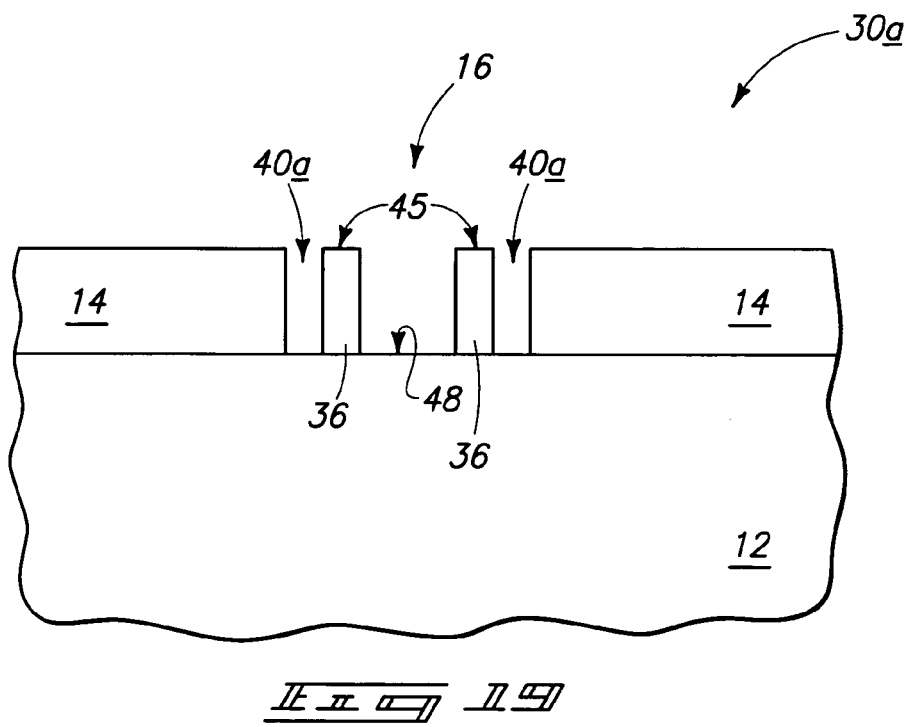
FIG. 19 is a diagrammatic sectional view of a semiconductor substrate in process in accordance with an aspect of the invention.
Figure 20:
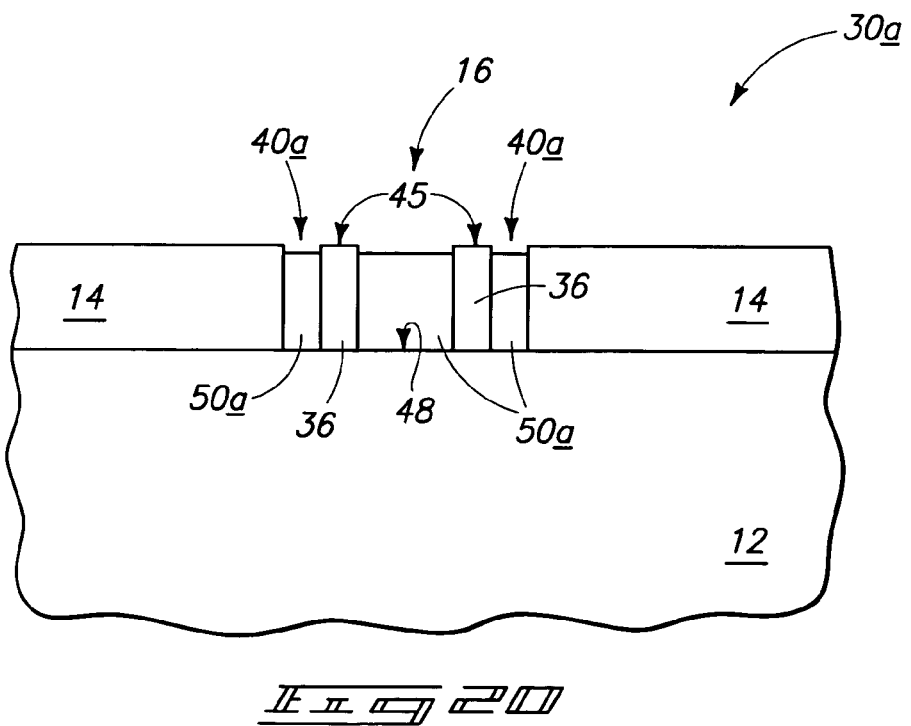
FIG. 20 is a view of the FIG. 19 substrate at a processing step subsequent to that shown by FIG. 19.

FIGS. 19 and 20 depict an alternate exemplary embodiment substrate fragment 30a. Like numerals from FIGS. 12-18 embodiment are utilized where appropriate, with differences being indicated with the suffix "a". Referring to FIG. 19, such differs from that of FIG. 16 in that all of second material 34 (not shown in FIG. 19) has been removed from between first material 14 and third material 36. Accordingly, spaces 40a extend all the way to monocrystalline material 12.

Referring to FIG. 20, silicon-comprising layer 50a has been epitaxially grown within opening 16 from monocrystalline material exposed at base 48 of opening 16 and from that exposed within spaces 40a.

Figure 21:
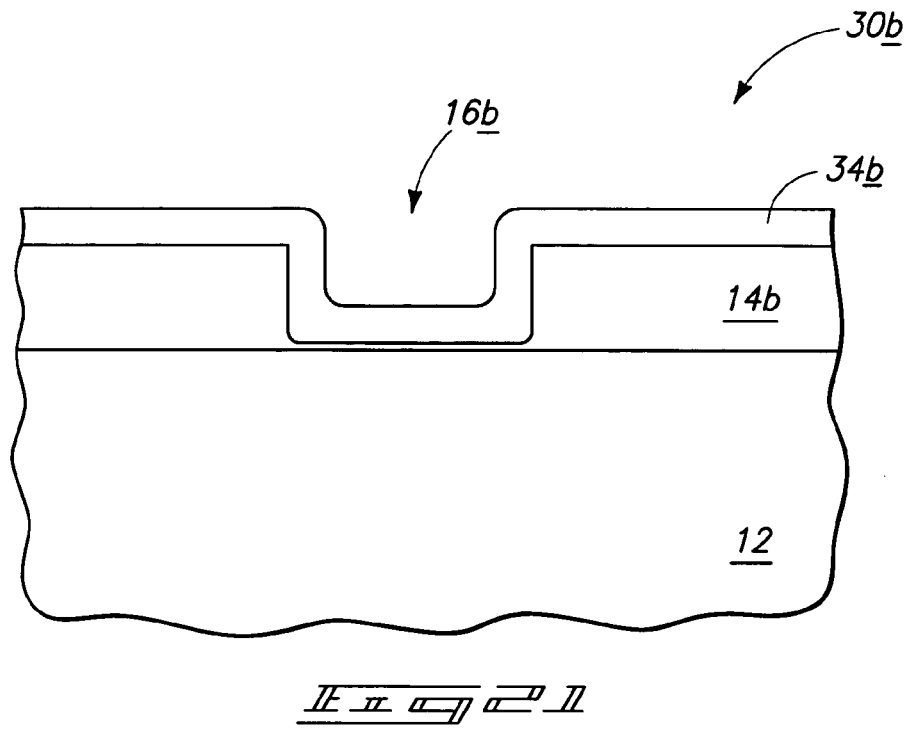
FIG. 21 is a diagrammatic sectional view of a semiconductor substrate in process in accordance with an aspect of the invention.

The above exemplary FIGS. 12-20 embodiments form opening 16 within first material 14 to extend to monocrystalline material 12 prior to depositing second material 34. By way of example only, an alternate exemplary embodiment substrate fragment 30b is described in connection with FIGS. 21-25 wherein the opening formed within the first material does not extend to monocrystalline material 12 prior to depositing the second material. Like numerals from the FIGS. 12-20 embodiments are utilized where appropriate, with differences being indicated with the suffix "b" or with different numerals. Referring to FIG. 21, opening 16b within material 14b has been initially formed to not extend to monocrystalline material 12. Second material 34b has been deposited to within opening 16b.

Figure 22:
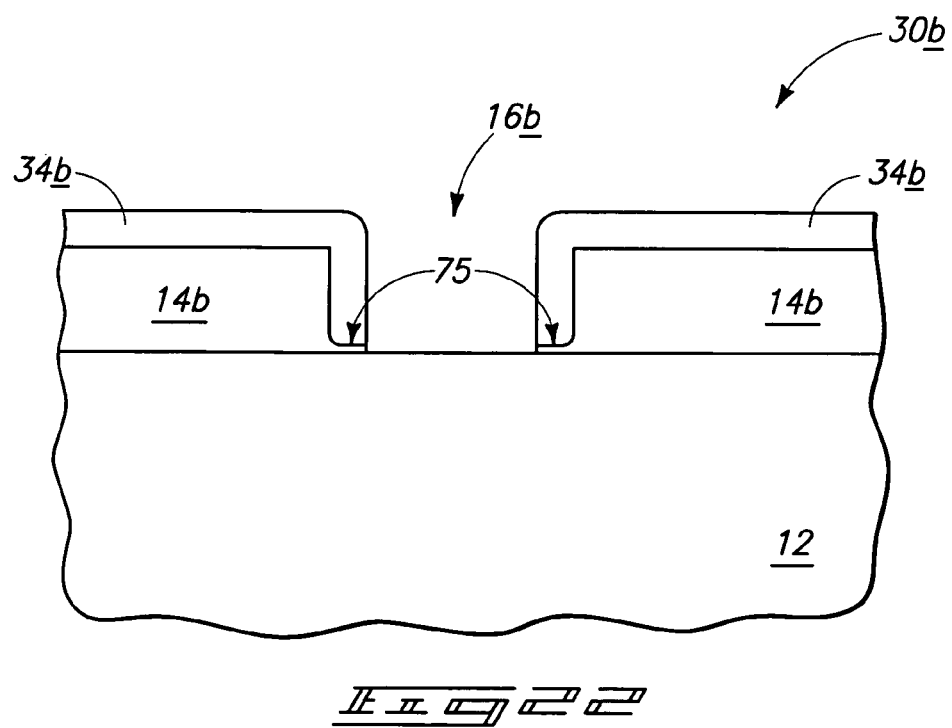
FIG. 22 is a view of the FIG. 21 substrate at a processing step subsequent to that shown by FIG. 21.

Referring to FIG. 22, second material 34b and material 14b within opening 16b have been anisotropically etched effective to expose monocrystalline material 12. Such etching might, of course, etch all of second material 34b from over first material 14b, although such is not depicted. For purposes of the continuing discussion, first material 14b within opening 16b can be considered as having respective shelves 75 of first material 14b over which second material 34b is received within opening 16b.

Figure 23:
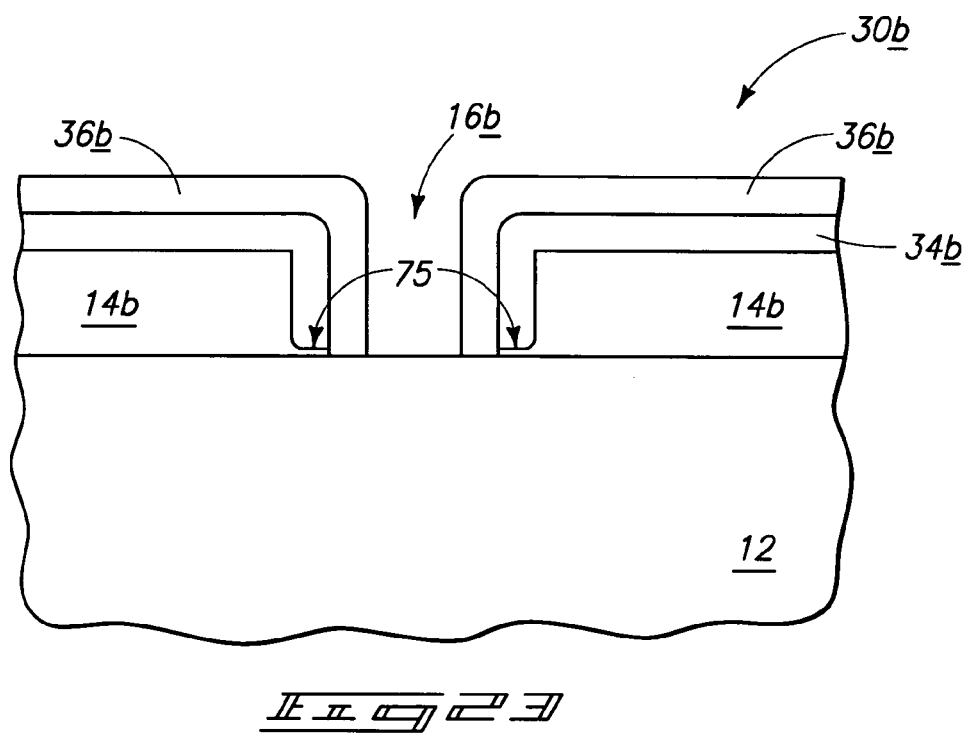
FIG. 23 is a view of the FIG. 22 substrate at a processing step subsequent to that shown by FIG. 22.

Referring to FIG. 23, third material 36b has been formed as shown over second material 34b within opening 16b. Material 36b in one preferred implementation has been deposited and anisotropically etched effective to expose monocrystalline material 12. Such etching might, of course, etch all of third material 36b from over first material 14b, although such is not depicted.

Figure 24:
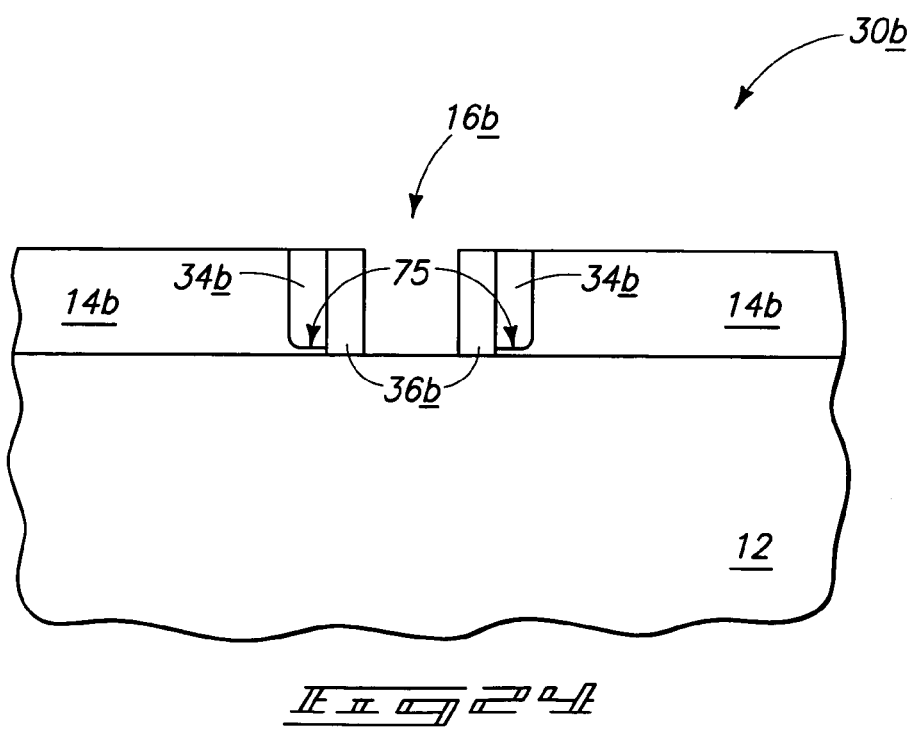
FIG. 24 is a view of the FIG. 23 substrate at a processing step subsequent to that shown by FIG. 23.

Referring to FIG. 24, third material 36b and second material 34b have been polished at least to an outer surface of first material 14b.

Figure 25:
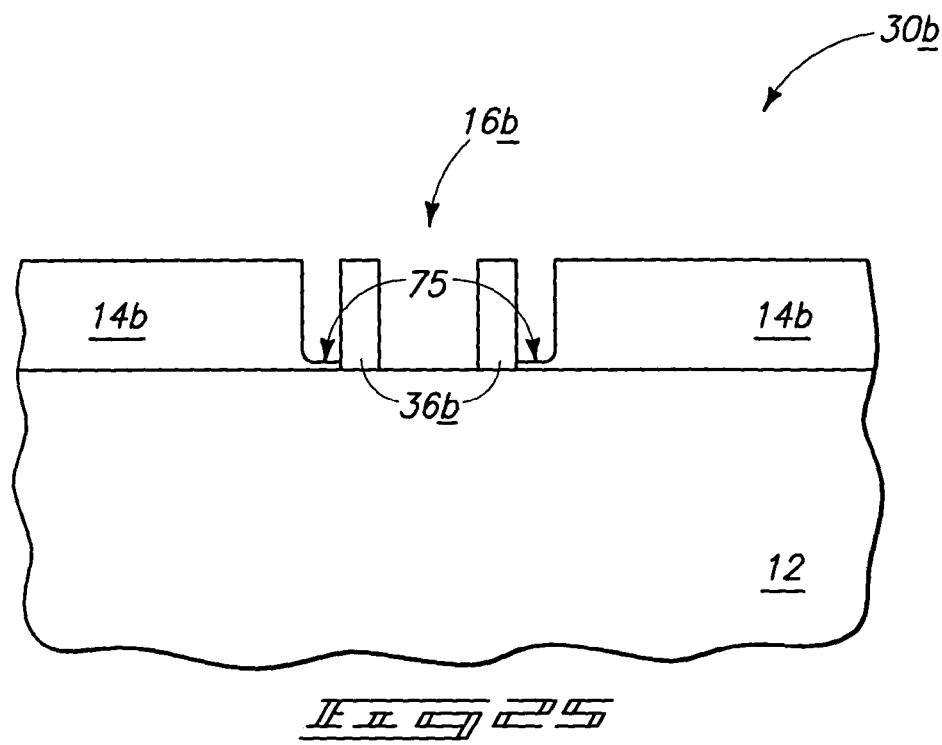
FIG. 25 is a view of the FIG. 24 substrate at a processing step subsequent to that shown by FIG. 24.

Referring to FIG. 25, all remaining of second material 34b has been etched from between first material 14b and third material 36b to shelf 75 of first material 16b.

Figure 26:
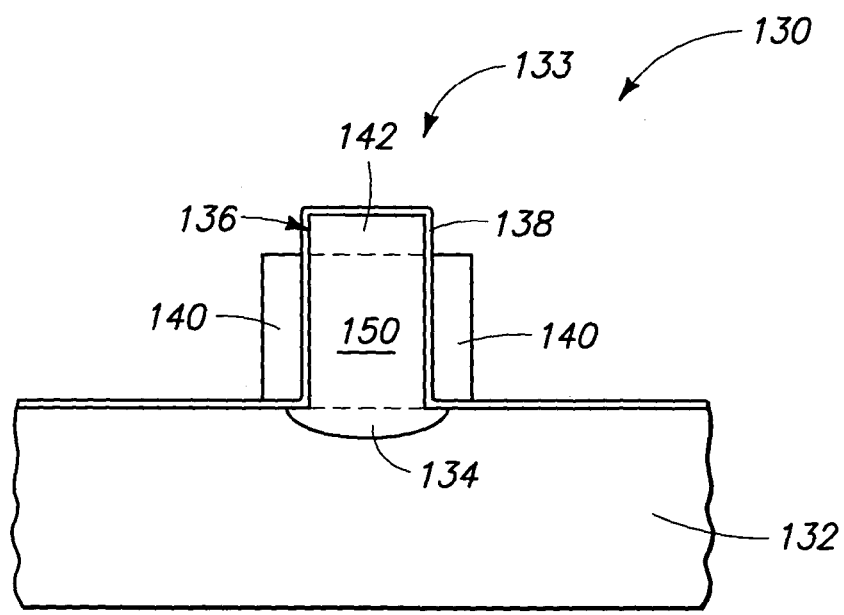
FIG. 26 is a diagrammatic sectional view of a semiconductor substrate in process in accordance with an aspect of the invention.

Attributes of the invention encompass methods of incorporating any of the above-described epitaxial layers into a component of a field effect transistor. By way of example only, a preferred such component comprises a channel region of a field effect transistor, and further preferably where the field effect transistor is vertically oriented. For example and by way of example only, FIG. 26 depicts a substrate fragment 130 comprising a substrate 132 and associated vertical field effect transistor 133. Substrate 132 preferably comprises a semiconductor substrate, and for example as depicted, transistor 133 comprises a diffusion region 134 or other region formed within semiconductive material (i.e., monocrystalline silicon, whether bulk, epitaxially grown or otherwise) and which comprises a source/drain region of transistor 133. Substrate fragment 130 comprises a projecting layer 136, for example including one or more of the epitaxial layers formed, and of compositions, as described above. A gate dielectric layer 138 is received over substrate 132 and epitaxial silicon-comprising projection 136. An exemplary preferred material is one or a combination of silicon dioxide and silicon nitride. A transistor gate 140 is received about projection 136. Exemplary preferred materials include one or a combination of conductively doped polysilicon, elemental metals, alloys of elemental metals, and conductive metal compounds. Projection 136 comprises a source/drain region 142 received elevationally outward of gate 140, and a channel region 150 therebetween. Conductivity enhancing doping within regions 134 and 142 would be higher than that of channel region 150, with transistor gate 140 being switchable to control current flow between source/drain regions 134 and 142 through channel region 150. Of course, some or all of the source/drain regions of the transistor might be fabricated to be encompassed by projection 136, with the gate 140 being sized appropriately.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a layer comprising epitaxial silicon, comprising:

providing an opening within a first material received over a monocrystalline material;

lining opposing sidewalls of the opening with a second material which is different in composition from the first material, monocrystalline material being exposed at a base of the opening between laterally spaced portions of the second material received within the opening;

within a chamber, epitaxially growing a silicon-comprising layer from the exposed monocrystalline material within the second material-lined opening;

within the same chamber in which the epitaxially growing occurs, in situ etching away at least a portion of the laterally spaced portions of the second material from the opening; and removing all of the first material within which the opening was provided from being received over the monocrystalline material and incorporating the epitaxially grown silicon-comprising layer into a channel region of a vertically oriented field effect transistor having one source/drain region received elevationally inward of the channel region and another source/drain region received elevationally outward of the channel region.

2. The method of claim 1 wherein the etching occurs after the growing.

3. The method of claim 1 wherein the etching occurs before the growing.

4. The method of claim 1 wherein the etching is selective relative to the first material.

5. The method of claim 1 wherein the opening formed within the first material extends to the monocrystalline material prior to said lining of the opposing sidewalls.

6. The method of claim 1 wherein the opening formed within the first material does not extend to the monocrystalline material prior to said lining of the opposing sidewalls.

7. The method of claim 1 wherein the opening comprises a line trench in the first material.

8. The method of claim 1 wherein the second material is insulative.

9. The method of claim 8 wherein the second material comprises at least one of $SiO_2$, $SiO_xN_y$, $Si_3N_4$, hafnium oxide and aluminum oxide.

10. The method of claim 9 wherein the second material comprises $SiO_2$.

11. The method of claim 9 wherein the second material comprises $SiO_xN_y$.

12. The method of claim 9 wherein the second material comprises $Si_3N_4$.

13. The method of claim 9 wherein the second material comprises hafnium oxide.

14. The method of claim 9 wherein the second material comprises aluminum oxide.

15. The method of claim 1 wherein the second material is conductive.

16. The method of claim 15 wherein the second material comprises doped carbon.

17. The method of claim 1 wherein lining of the opposing sidewalls comprises deposition of the second material over the first material and to within the opening, followed by anisotropic etching of the second material effective to expose the monocrystalline material.

18. The method of claim 1 wherein the etching occurs at a temperature below a temperature at which the growing occurs.

19. The method of claim 1 wherein the etching occurs at a temperature above a temperature at which the growing occurs.

20. The method of claim 1 wherein the etching occurs at a temperature at which the growing occurs.

21. The method of claim 1 wherein the etching is of all remaining of the second material lining.

22. The method of claim 1 wherein the etching is of only a portion of the second material lining.

23. The method of claim 22 wherein the second material lining comprises an elevational thickness, the portion comprising only part of the elevational thickness.

24. The method of claim 22 wherein the second material lining comprises an elevational thickness, the portion comprising all of an elevational thickness portion.

25. A method of forming a layer comprising epitaxial silicon, comprising:

providing an opening within a first material received over a monocrystalline material;

lining opposing sidewalls of the opening with a second material which is different in composition from the first material by deposition of the second material over the first material and to within the opening over the monocrystalline material, followed by anisotropic etching of the second material effective to expose the monocrystalline material between laterally spaced portions of the second material received within the opening;

within a chamber, epitaxially growing a silicon-comprising layer from the exposed monocrystalline material within the second material-lined opening;

after the growing and within the same chamber in which the epitaxially growing occurred, in situ etching away at least a portion of the laterally spaced portions of the second material from the opening selectively relative to the first material; and removing all of the first material within which the opening was provided from being received over the monocrystalline material.

26. The method of claim 25 wherein the opening formed within the first material extends to the monocrystalline material prior to said lining of the opposing sidewalls.

27. The method of claim 25 wherein the opening formed within the first material does not extend to the monocrystalline material prior to said lining of the opposing sidewalls.

28. The method of claim 25 wherein the opening comprises a line trench in the first material.

29. The method of claim 25 wherein the second material is insulative.

30. The method of claim 25 wherein the second material is conductive.

31. The method of claim 25 wherein the etching occurs at a temperature below a temperature at which the growing occurs.

32. The method of claim 25 wherein the etching occurs at a temperature above a temperature at which the growing occurs.

33. The method of claim 25 wherein the etching occurs at a temperature at which the growing occurs.

34. The method of claim 25 wherein the etching is of all remaining of the second material lining.

35. The method of claim 25 wherein the etching is of only a portion of the second material lining.

36. The method of claim 35 wherein the second material lining comprises an elevational thickness, the portion comprising only part of the elevational thickness.

37. The method of claim 35 wherein the second material lining comprises an elevational thickness, the portion comprising all of an elevational thickness portion.

38. A method of forming a layer comprising epitaxial silicon, comprising:

providing a first material over a monocrystalline material, the first material comprising semiconductive material;

providing an opening within the first material;

lining opposing sidewalls of the opening with a second material which is different in composition from the first material, monocrystalline material being exposed at a base of the opening between laterally spaced portions of the second material received within the opening;

within a chamber, epitaxially growing a silicon-comprising layer from the exposed monocrystalline material within the second material-lined opening;

within the same chamber in which the epitaxially growing occurs, in situ etching away at least a portion of the laterally spaced portions of the second material from the opening; and removing all of the semiconductive material of the first material within which the opening was provided from being received over the monocrystalline material.

39. The method of claim 38 wherein the semiconductive material is conductively doped.

40. A method of forming a layer comprising epitaxial silicon, comprising:

providing a first material over a monocrystalline material, the first material comprising semiconductive material;

providing an opening within the first material;

lining opposing sidewalls of the opening with a second material which is different in composition from the first material by deposition of the second material over the first material and to within the opening over the monocrystalline material, followed by anisotropic etching of the second material effective to expose the monocrystalline material between laterally spaced portions of the second material received within the opening;

within a chamber, epitaxially growing a silicon-comprising layer from the exposed monocrystalline material within the second material-lined opening;

after the growing and within the same chamber in which the epitaxially growing occurred, in situ etching away at least a portion of the laterally spaced portions of the second material from the opening selectively relative to the first material; and removing all of the semiconductive material of the first material within which the opening was provided from being received over the monocrystalline material.

41. The method of claim 40 wherein the semiconductive material is conductively doped.

42. The method of claim 25 comprising incorporating the epitaxially grown silicon-comprising layer into a channel region of a vertically oriented field effect transistor having one source/drain region received elevationally inward of the channel region and another source/drain region received elevationally outward of the channel region.

43. A method of forming a layer comprising epitaxial silicon, comprising:

providing an opening within a first material received over a monocrystalline material;

lining opposing sidewalls of the opening with a second material which is different in composition from the first material, monocrystalline material being exposed at a base of the opening between laterally spaced portions of the second material received within the opening;

within a chamber, epitaxially growing a silicon-comprising layer from the exposed monocrystalline material within the second material-lined opening;

within the same chamber in which the epitaxially growing occurs, in situ etching away a portion of the laterally spaced portions of the second material from the opening; and removing all of the first material within which the opening was provided from being received over the monocrystalline material.

44. The method of claim 25 further comprising incorporating the epitaxially grown silicon-comprising layer into a channel region of a vertically oriented field effect transistor.

45. The method of claim 25 wherein the opening comprises a line trench in the first material.

\* \* \* \* \*